(12) United States Patent
Jung

(10) Patent No.: US 12,532,623 B2
(45) Date of Patent: Jan. 20, 2026

(54) DISPLAY DEVICE AND METHOD OF REPAIRING THE SAME

(71) Applicant: SAMSUNG DISPLAY CO., LTD., Yongin-si (KR)

(72) Inventor: Inyoung Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 400 days.

(21) Appl. No.: 18/214,332

(22) Filed: Jun. 26, 2023

(65) Prior Publication Data

US 2024/0122002 A1 Apr. 11, 2024

(30) Foreign Application Priority Data

Oct. 6, 2022 (KR) .................. 10-2022-0128085

(51) Int. Cl.
*H10K 59/131* (2023.01)
*H10K 59/12* (2023.01)
*H10K 71/00* (2023.01)

(52) U.S. Cl.
CPC ....... *H10K 59/131* (2023.02); *H10K 59/1201* (2023.02); *H10K 71/861* (2023.02)

(58) Field of Classification Search
CPC ............ H10K 59/131; H10K 59/1201; H10K 71/861; H10K 50/813; H10K 59/124; G09G 2330/08
See application file for complete search history.

(56) References Cited

U.S. PATENT DOCUMENTS 7,471,351 B2 12/2008 Choi
8,227,977 B2 * 7/2012 Lhee .................. H10K 71/60
445/2
(Continued)

FOREIGN PATENT DOCUMENTS

KR 100382456 B1 5/2003
KR 100798539 B1 1/2008
(Continued)

OTHER PUBLICATIONS

Byoungyoon Lee, et al.; A low-cure-temperature copper nano ink for highly conductive printed electrodes; Curr. Appl. Phys. 2009, 9, e157-e160.

*Primary Examiner* — J. E. Schoenholtz
(74) *Attorney, Agent, or Firm* — CANTOR COLBURN LLP

(57) ABSTRACT

A display device includes a substrate, a first wiring disposed on the substrate and extending in a first direction, an inter-insulating layer disposed on the first wiring, a 2-$1^{st}$ wiring disposed on the inter-insulating layer and extending in a second direction crossing the first direction, a 2-$2^{nd}$ wiring disposed on the inter-insulating layer, disconnected from the 2-$1^{st}$ wiring, and crossing the first wiring, a 2-$3^{rd}$ wiring disposed on the inter-insulating layer, and disconnected from the 2-$2^{nd}$ wiring, a first insulating layer which is disposed on the 2-$1^{st}$ to the 2-$3^{rd}$ wirings and in which a first through-hole and a second through-hole are defined, the first through-hole exposing a portion of the 2-$1^{st}$ wiring, and the second through-hole exposing a portion of the 2-$3^{rd}$ wiring, and a first pixel electrode connected to the 2-$1^{st}$ wiring through the first through-hole, and connected to the 2-$3^{rd}$ wiring through the second through-hole.

15 Claims, 13 Drawing Sheets

(56) References Cited

U.S. PATENT DOCUMENTS 9,167,663 B2 * 10/2015 Kim .................... G09G 3/3233
2014/0014913 A1 * 1/2014 Lee ..................... H10H 20/857
438/4

FOREIGN PATENT DOCUMENTS

KR         102145850      8/2020
KR         102174003     11/2020

* cited by examiner

DISPLAY DEVICE AND METHOD OF REPAIRING THE SAME

This application claims priority to Korean Patent Application No. 10-2022-0128085, filed on Oct. 6, 2022, and all the benefits accruing therefrom under 35 U.S.C. § 119, the content of which in its entirety is herein incorporated by reference.

BACKGROUND

1. Field

Embodiments relate to a display device and a method of repairing the same, and more particularly, to a display device in which a short occurring in a wiring included in a high-resolution display may be repaired, and a method of repairing the display device.

2. Description of the Related Art

Display devices display images by receiving information about the images. In the display devices, a gate line and a data line may be arranged to cross each other when viewed from a direction perpendicular to a substrate.

SUMMARY

When a short occurs between a gate line and a data line in a high-resolution display device, it may be difficult to repair the data line by a repair method of the related art.

Embodiments include a display device in which a short occurring in a wiring included in a high-resolution display may be repaired, and a method of repairing the display device. However, such an objective is just an example, and the scope of the disclosure is not limited thereto.

Additional features will be set forth in part in the description which follows and, in part, will be apparent from the description, or may be learned by practice of the presented embodiments of the disclosure.

In an embodiment of the disclosure, a display device includes a substrate, a first wiring disposed on the substrate and extending in a first direction, an inter-insulating layer disposed on the first wiring, a $2\text{-}1^{st}$ wiring disposed on the inter-insulating layer and extending in a second direction crossing the first direction, a $2\text{-}2^{nd}$ wiring disposed on the inter-insulating layer, adjacent to the $2\text{-}1^{st}$ wiring in the second direction, disconnected from the $2\text{-}1^{st}$ wiring, and crossing the first wiring in a plan view, a $2\text{-}3^{rd}$ wiring disposed on the inter-insulating layer, adjacent to the $2\text{-}2^{nd}$ wiring in the second direction, and disconnected from the $2\text{-}2^{nd}$ wiring, a first insulating layer which is disposed on the $2\text{-}1^{st}$ to the $2\text{-}3^{rd}$ wirings and in which a first through-hole and a second through-hole are defined, the first through-hole exposing a portion of the $2\text{-}1^{st}$ wiring, and the second through-hole exposing a portion of the $2\text{-}3^{rd}$ wiring, and a first pixel electrode disposed on the first insulating layer, connected to the $2\text{-}1^{st}$ wiring through the first through-hole, and connected to the $2\text{-}3^{rd}$ wiring through the second through-hole.

In an embodiment, the $2\text{-}2^{nd}$ wiring may include a same material as a material of the $2\text{-}1^{st}$ wiring, and may have a same layer structure as a layer structure of the $2\text{-}1^{st}$ wiring.

In an embodiment, the $2\text{-}3^{rd}$ wiring may include a same material as a material of the $2\text{-}1^{st}$ wiring, and may have a same layer structure as a layer structure of the $2\text{-}1^{st}$ wiring.

In an embodiment, in the plan view, the $2\text{-}2^{nd}$ wiring may be disposed between the first through-hole and the second through-hole.

In an embodiment, the first pixel electrode may have a shape corresponding to a shape of the $2\text{-}2^{nd}$ wiring.

In an embodiment, the first pixel electrode may be disposed along the $2\text{-}2^{nd}$ wiring.

In an embodiment, in the plan view, a length of the first pixel electrode in the second direction may be greater than a length of the $2\text{-}2^{nd}$ wiring in the second direction.

In an embodiment, in the plan view, an opening extending in the first direction, exposing the first insulating layer, and crossing the $2\text{-}2^{nd}$ wiring may be defined in the first wiring.

In an embodiment of the disclosure, a method of repairing a display device includes forming a first wiring on a substrate, an inter-insulating layer on the first wiring, and a second wiring on the inter-insulating layer, the first wiring extending in a first direction, and the second wiring extending in a second direction crossing the first direction, forming a $2\text{-}1^{st}$ wiring, a $2\text{-}2^{nd}$ wiring, and a $2\text{-}3^{rd}$ wiring on the inter-insulating layer by disconnecting the second wiring, the $2\text{-}1^{st}$ wiring extending in the second direction crossing the first direction, the $2\text{-}2^{nd}$ wiring extending from the $2\text{-}1^{st}$ wiring in the second direction, being disconnected from the $2\text{-}1^{st}$ wiring, and crossing the first wiring in a plan view, and the $2\text{-}3^{rd}$ wiring extending from the $2\text{-}2^{nd}$ wiring in the second direction and being disconnected from the $2\text{-}2^{nd}$ wiring, forming a first insulating layer on the $2\text{-}1^{st}$ to $2\text{-}3^{rd}$ wirings, defining a first through-hole and a second through-hole in the first insulating layer, the first through-hole exposing a portion of the $2\text{-}1^{st}$ wiring, and the second through-hole exposing a portion of the $2\text{-}3^{rd}$ wiring, and forming a first pixel electrode disposed on the first insulating layer, connected to the $2\text{-}1^{st}$ wiring through the first through-hole, and connected to the $2\text{-}3^{rd}$ wiring through the second through-hole.

In an embodiment, the method may further include, after the forming the first pixel electrode, changing a shape of the first pixel electrode to a shape corresponding to the $2\text{-}2^{nd}$ wiring.

In an embodiment, in the plan view, the $2\text{-}2^{nd}$ wiring may be disposed between the first through-hole and the second through-hole.

In an embodiment, in the plan view, the first pixel electrode may be disposed along the $2\text{-}2^{nd}$ wiring.

In an embodiment, in the plan view, a length of the first pixel electrode in the second direction may be greater than a length of the $2\text{-}2^{nd}$ wiring in the second direction.

In an embodiment, the forming the second wiring may include, after forming the first wiring, defining an opening extending in the first direction and exposing the inter-insulating layer in the first wiring.

In an embodiment, in the plan view, the $2\text{-}2^{nd}$ wiring may cross the opening.

BRIEF DESCRIPTION OF THE DRAWINGS

The above and other features and advantages of illustrative embodiments of the disclosure will be more apparent from the following description taken in conjunction with the accompanying drawings, in which.

DETAILED DESCRIPTION

Figure 1:
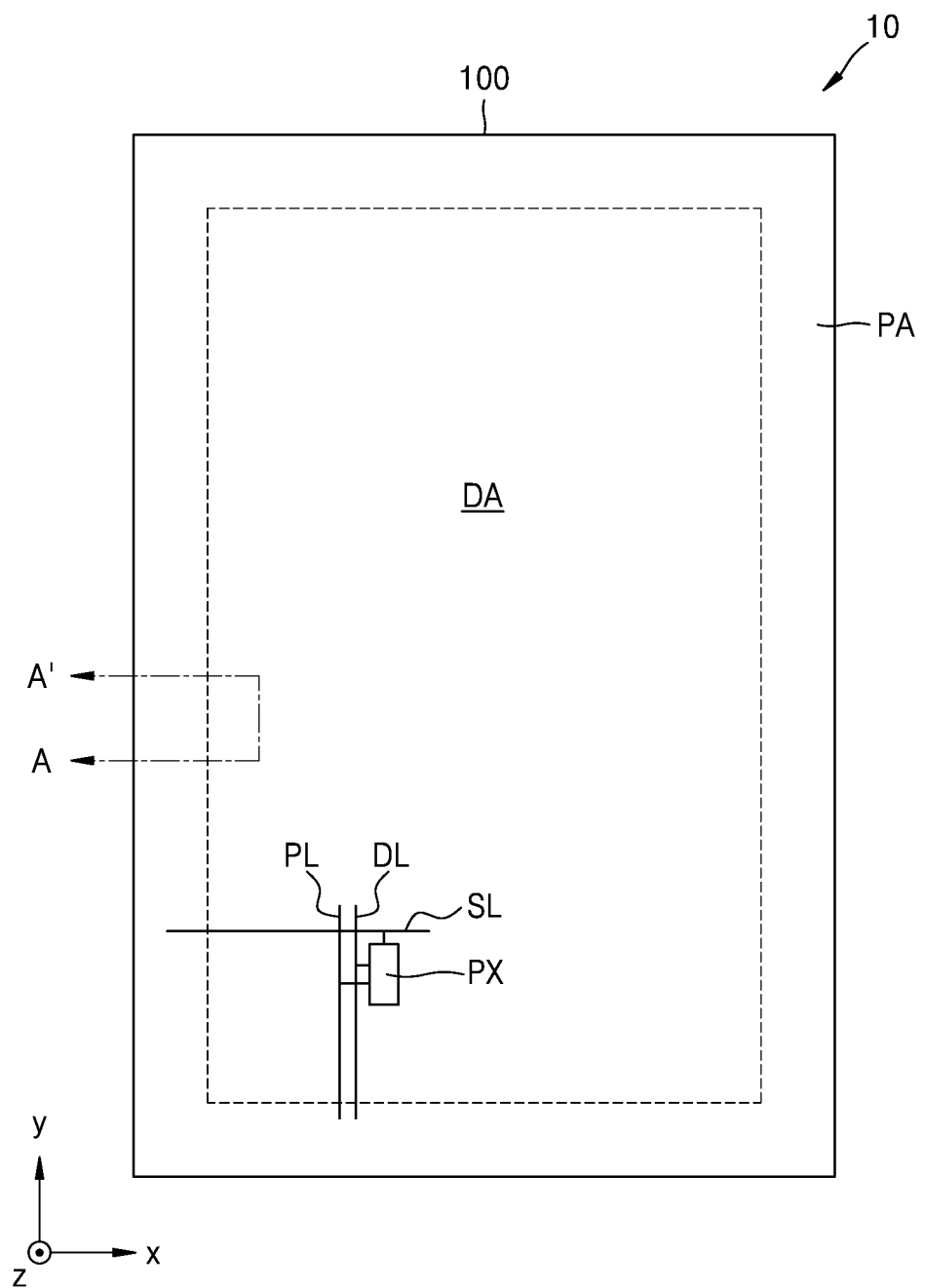
FIG. 1 is a schematic plan view of an embodiment of a display device.

Reference will now be made in detail to embodiments, embodiments of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, illustrative embodiments will be illustrated in the drawings and described in detail in the written description. Effects and features of the disclosure, and methods for achieving them will be clarified with reference to embodiments described below in detail with reference to the drawings. However, the disclosure is not limited to the following embodiments, and may be embodied in various forms.

Hereinafter, embodiments of the disclosure will be described in detail with reference to the accompanying drawings. When describing embodiments with reference to the drawings, the same or corresponding elements are denoted by the same reference numerals, and redundant descriptions thereof are omitted.

In the following embodiments, when an element, such as a layer, a film, a region, or a plate, is also referred to as being "on" another element, the element may be directly on the other element, or intervening elements may be therebetween. Sizes of elements in the drawings may be exaggerated or reduced for convenience of description. Since sizes and thicknesses of elements in the drawings are arbitrarily illustrated for convenience of description, for example, the disclosure is not limited thereto.

In the following embodiments, the x-axis, the y-axis, and the z-axis are not limited to three axes of the quadrangular (e.g., rectangular) coordinate system, and may be interpreted in a broader sense. The x-axis, the y-axis, and the z-axis may be perpendicular to one another, or may represent different directions that are not perpendicular to one another, for example.

Hereinafter, a display device in an embodiment is described in detail based on the above descriptions.

FIG. 1 is a schematic plan view of an embodiment of a display device.

As shown in FIG. 1, the display device in an embodiment may include a display panel 10. The display device may be of any type as long as the display device includes the display panel 10. In an embodiment, the display device may include various devices, such as a smartphone, a tablet, a laptop computer, a television, a billboard, or the like. The display device in an embodiment includes thin-film transistors ("TFTs"), a capacitor, or the like, and the TFTs, the capacitor, or the like may be implemented by conductive layers and insulating layers.

The display panel 10 may include a display area DA and a peripheral area PA arranged outside the display area DA. FIG. 1 shows that the display area DA has a quadrangular (e.g., rectangular) shape. However, the disclosure is not limited thereto. The display area DA may have various shapes, such as a circular shape, an oval shape, a polygonal shape, a shape of a predetermined figure, or the like.

The display area DA is an area in which an image is displayed and a plurality of pixels PX may be arranged therein. Each pixel PX may include a display element, such as an organic light-emitting diode. Each pixel PX may emit, e.g., red, green, or blue light. The pixel PX may be connected to a pixel circuit including a TFT, a storage capacitor, or the like. The pixel circuit may be connected to a scan line SL which transmits a scan signal to the pixel circuit, a data line DL which crosses the scan line SL and transmits a data signal to the pixel circuit, a driving voltage line PL which supplies a driving voltage to the pixel circuit, or the like. The scan line SL may extend in an x direction (hereinafter, a second direction), and the data line DL and the driving voltage line PL may extend in a y direction (hereinafter, a first direction).

The pixel PX may emit light having a luminance corresponding to an electrical signal from the pixel circuit to which the pixel PX is electrically connected. The display area DA may display a predetermined image through light emitted from the pixel PX. For reference, the pixel PX may be defined as an emission area that emits light of any one color of red, green, and blue, as described above.

The peripheral area PA, in which the pixel PX is not disposed, may be an area in which no image is displayed. A power supply wiring or the like for driving the pixel PX may be disposed in the peripheral area PA. In addition, a plurality of pads may be arranged in the peripheral area PA, and a printed circuit board including a driving circuit portion or an integrated circuit ("IC") element, such as a driver IC, may be electrically connected to the pads.

For reference, because the display panel 10 includes a substrate 100, it may be understood that the substrate 100 includes the display area DA and the peripheral area PA. The substrate 100 is described below in detail.

In addition, a plurality of transistors may be arranged in the display area DA. According to the type (N-type or P-type) and/or operating conditions of a transistor, a first terminal of the transistor may be a source electrode or a drain electrode, and a second terminal thereof may be an electrode different from the first terminal. In an embodiment, when the first terminal is a source electrode, the second terminal may be a drain electrode, for example.

The transistors may include a driving transistor, a data write transistor, a compensation transistor, an initialization transistor, an emission control transistor, or the like. The driving transistor may be connected between the driving voltage line PL and an organic light-emitting diode ("OLED"), and the data write transistor may be connected to the data line DL and the driving transistor and may perform a switching operation of transmitting a data signal transmitted through the data line DL.

The compensation transistor may be turned on according to a scan signal received through the scan line SL, and may connect the driving transistor to the OLED, thereby compensating for a threshold voltage of the driving transistor.

The initialization transistor may be turned on according to a scan signal received through the scan line SL, and may transmit an initialization voltage to a gate electrode of the driving transistor, thereby initializing the gate electrode of the driving transistor. A scan line connected to the initialization transistor may be a separate scan line that is different from a scan line connected to the compensation transistor.

The emission control transistor may be turned on according to an emission control signal received through an emission control line, and as a result, a driving current may flow in the OLED.

The OLED may include a pixel electrode (anode) and a counter electrode (cathode), and the counter electrode (not shown) may receive a common voltage. The OLED may display an image by receiving a driving current from the driving transistor and emitting light.

Hereinafter, an organic light-emitting display device is described in an embodiment of the display device, but the display device of the disclosure is not limited thereto. In another embodiment, the display device in an embodiment may include display devices, such as an inorganic light-emitting display device (or an inorganic electroluminescent ("EL") display device) and a quantum dot light-emitting display device. In an embodiment, an emission layer of a display element included in the display device may include an organic material or an inorganic material. In addition, the display device may include an emission layer and quantum dots disposed on a path of light emitted from the emission layer, for example.

Figure 2:
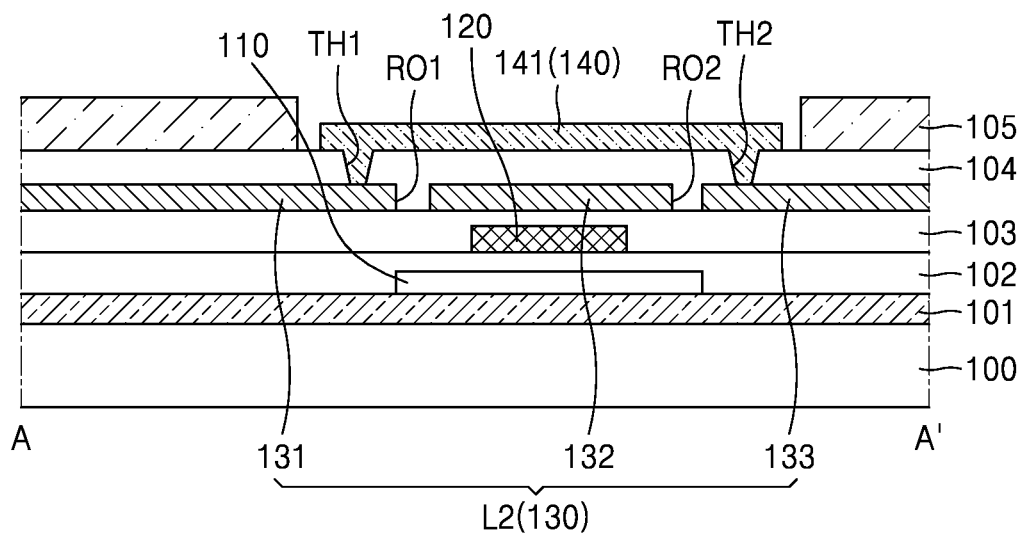
FIG. 2 is a schematic cross-sectional view of a region taken along line A-A' in the display device of FIG. 1.
Figure 3:
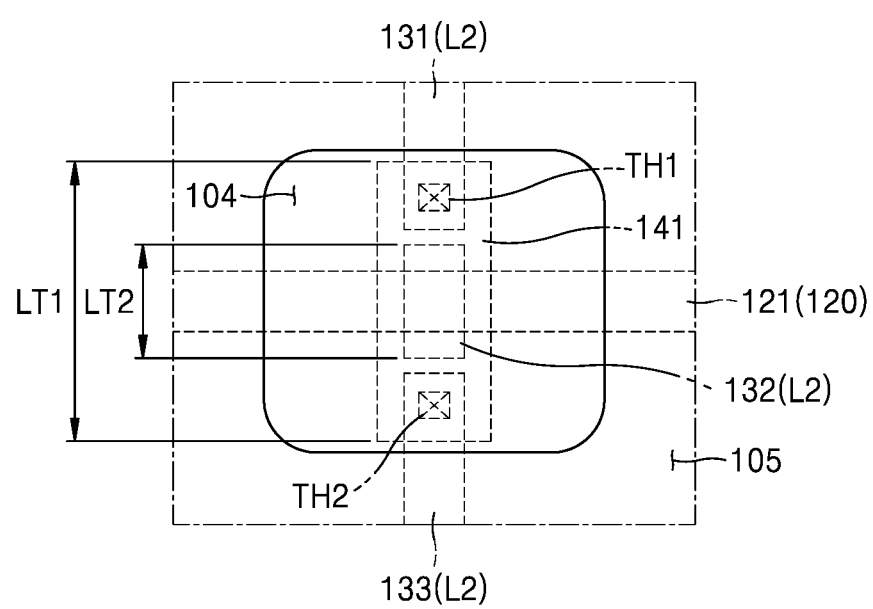
FIG. 3 is a schematic plan view of the vicinity of the region shown in FIG. 2 in a direction perpendicular to a substrate.

FIG. 2 is a schematic cross-sectional view of a region taken along line A-A' in the display device of FIG. 1, and FIG. 3 is a schematic plan view of the vicinity of the region shown in FIG. 2 in a direction perpendicular to the substrate.

As shown in FIGS. 2 and 3, the display device in the illustrated embodiment may include the substrate 100, a buffer layer 101, a semiconductor layer 110, a gate insulating layer 102, a gate layer 120, an inter-insulating layer 103, a first conductive layer 130, and a first insulating layer 104, a first pixel electrode 141, and a pixel-defining layer 105.

The substrate 100 may include, as described above, areas corresponding to the display area DA and the peripheral area PA outside the display area DA. The substrate 100 may include various flexible or bendable materials. In an embodiment, the substrate 100 may include glass, metal, or polymer resin. In addition, the substrate 100 may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate, for example. The substrate 100 may be variously modified. In an embodiment, the substrate 100 may have a multi-layered structure including two layers and a barrier layer arranged between the two layers, the two layers each including the polymer resin described above, and the barrier layer including an inorganic material, such as silicon oxide, silicon nitride, silicon oxynitride, or the like, for example.

The buffer layer 101 may be disposed on the substrate 100. The buffer layer 101 may prevent diffusion of impurity ions and infiltration of moisture or external air, and may serve as a barrier layer for planarizing a surface, and/or a blocking layer. The buffer layer 101 may include silicon oxide, silicon nitride, or silicon oxynitride. In addition, the buffer layer 101 may control a heat supply speed during a crystallization process for forming the semiconductor layer 110, so that the semiconductor layer 110 may be uniformly crystalized.

The semiconductor layer 110 may be disposed on the buffer layer 101. The semiconductor layer 110 may include polysilicon, and may include a channel region that is not doped with impurities, and a source region and a drain region at opposite sides of the channel region that are doped with impurities. Here, the impurities vary depending on the type of a TFT, and may be, e.g., N-type impurities or P-type impurities.

The gate insulating layer 102 may be disposed on the semiconductor layer 110. The gate insulating layer 102 may be provided to secure insulation between the semiconductor layer 110 and the gate layer 120. The gate insulating layer 102 may include an inorganic material, such as silicon oxide, silicon nitride, silicon oxynitride, and/or the like, and may be disposed between the semiconductor layer 110 and the gate layer 120. In addition, the gate insulating layer 102 may have a shape corresponding to the entirety of the surface of the substrate 100, and may have a structure in which contact holes are defined in preset portions. As such, an insulating layer including an inorganic material may be formed by chemical vapor deposition ("CVD") or atomic layer deposition ("ALD"). This also applies to embodiments described below and modifications thereof.

As shown in FIGS. 2 and 3, the gate layer 120 may be disposed on the gate insulating layer 102. The gate layer 120 may be patterned into a plurality of wirings as well as a first wiring 121. When viewed from the direction perpendicular to the substrate 100 (i.e., in a plan view), the first wiring 121 may extend in the first direction, and may cross a 2-$2^{nd}$ wiring described below. In addition, when viewed from the direction perpendicular to the substrate 100, the first wiring 121 may be a wiring overlapping the first pixel electrode 141 described below, from among the plurality of wirings.

The gate layer 120 may be disposed at a position vertically overlapping the semiconductor layer 110, and may include at least one metal from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu). The gate layer 120 may be patterned into the first wiring 121 or the like having a preset shape through a patterning process.

The inter-insulating layer 103 may be disposed on the gate layer 120. The inter-insulating layer 103 may cover the gate layer 120 as well as the first wiring 121. The inter-insulating layer 103 may include an inorganic material. In an embodiment, the inter-insulating layer 103 may include metal oxide or metal nitride, and in detail, the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZrO_2$), or the like, for example. In some embodiments, the inter-insulating layer 103 may have a dual structure of SiOx/SiNy or SiNx/SiOy.

The first conductive layer 130 may be disposed on the inter-insulating layer 103. The first conductive layer 130 may serve as an electrode connected to the source/drain region of the semiconductor layer 110 through a through-hole in the inter-insulating layer 103. The first conductive layer 130 may be patterned into a plurality of wirings as well as a second wiring L2, and among the plurality of wirings of the first conductive layer 130, the second wiring L2 may be a wiring overlapping the first pixel electrode 141 described below, when viewed from the direction perpendicular to the substrate 100.

The first conductive layer 130 may include at least one metal selected from among Al, Pt, Pd, Ag, Mg, Au, Ni, Nd, Ir, Cr, Li, Ca, Mo, Ti, W, and Cu. In an embodiment, the second wiring L2 may include a Ti layer, an Al layer, and/or a Cu layer, for example. The second wiring L2 may be formed to have a preset shape through a patterning process.

In some cases, the second wiring L2 may be shorted to the first wiring 121. When the second wiring L2 is shorted to the first wiring 121, a pixel at a point at which the short between the second wiring L2 and the first wiring 121 occurs may be defective. In addition, all pixels receiving signals from the second wiring L2 may be defective. Thus, even when it is desired to give up one pixel, it is desired to resolve a defect due to the short between the second wiring L2 and the first wiring 121. In this regard, the short between the second wiring L2 and the first wiring 121 refers to a short occurring at or around a point at which the second wiring L2 and the first wiring 121 cross each other, when viewed from the direction perpendicular to the substrate 100.

The second wiring L2 may be disconnected by an intense light (e.g., a laser). In this regard, the laser is irradiated from a laser generating device, and may be used to precisely cut the second wiring L2. When viewed from the direction perpendicular to the substrate 100, the laser generating device may cut the second wiring L2 at at least two locations around the point at which the second wiring L2 and the first wiring 121 cross each other, and may irradiate a laser to an area in which the second wiring L2 and the first wiring 121 do not overlap each other. This may be to prevent a case in which the first wiring 121 is also cut.

As shown in FIGS. 2 and 3, the second wiring L2 may be divided into a $2\text{-}1^{st}$ wiring 131, a $2\text{-}2^{nd}$ wiring 132, and a $2\text{-}3^{rd}$ wiring 133. That is, the laser generating device may form the $2\text{-}2^{nd}$ wiring 132 by cutting between the $2\text{-}1^{st}$ wiring 131 and the $2\text{-}2^{nd}$ wiring 132, and may form the $2\text{-}3^{rd}$ wiring 133 by cutting between the $2\text{-}2^{nd}$ wiring 132 and the $2\text{-}3^{rd}$ wiring 133.

A portion of the second wiring L2 that is shorted to the first wiring 121 may be the $2\text{-}2^{nd}$ wiring 132. Accordingly, it is desired to separate the $2\text{-}2^{nd}$ wiring 132 from the second wiring L2 by the laser generating device. In addition, because the $2\text{-}1^{st}$ wiring 131 is electrically connected to the $2\text{-}3^{rd}$ wiring 133 through the first pixel electrode 141 described below, a defect, such as a short occurring in the $2\text{-}2^{nd}$ wiring, may be repaired.

The second wiring L2 may include a first cutting region RO1 defined by a laser between the $2\text{-}1^{st}$ wiring 131 and the $2\text{-}2^{nd}$ wiring 132 and exposing the inter-insulating layer 103. The first cutting region RO1 may not vertically overlap the first wiring 121. When viewed from the direction perpendicular to the substrate 100, the first cutting region RO1 may be apart from an edge of the first wiring 121 in the second direction.

In addition, the second wiring L2 may include a second cutting region RO2 defined by a laser between the $2\text{-}2^{nd}$ wiring 132 and the $2\text{-}3^{rd}$ wiring 133 and exposing the inter-insulating layer 103.

The second cutting region RO2 may not vertically overlap the first wiring 121. When viewed from the direction perpendicular to the substrate 100, the second cutting region RO2 may be disposed in a direction opposite to a direction in which the first cutting region RO1 is disposed with respect to the first wiring 121. The second cutting region RO2 may be apart from the edge of the first wiring 121 in the direction opposite to the direction in which the first cutting region RO1 is disposed with respect to the first wiring 121.

When viewed from the direction perpendicular to the substrate 100, the first cutting region RO1 and the second cutting region RO2 may be disposed between a first through-hole TH1 and a second through-hole TH2. In addition, when viewed from the direction perpendicular to the substrate 100, the first cutting region RO1 and the second cutting region RO2 may be covered by the first pixel electrode 141 described below.

The first insulating layer 104 described below may be disposed in the first cutting region RO1 and the second cutting region RO2. That is, as the first insulating layer 104 described below is formed, the first cutting region RO1 and the second cutting region RO2 may be filled.

The $2\text{-}1^{st}$ wiring 131 may be disposed on the inter-insulating layer 103, may extend in the second direction crossing the first direction, and may be part of the second wiring L2. When viewed from the direction perpendicular to the substrate 100, the $2\text{-}1^{st}$ wiring 131 may not overlap the first wiring 121.

The $2\text{-}2^{nd}$ wiring 132 may be disposed on the inter-insulating layer 103. The $2\text{-}2^{nd}$ wiring 132 may extend in the second direction with respect to the $2\text{-}1^{st}$ wiring 131, and may be disconnected from the $2\text{-}1^{st}$ wiring 131. The $2\text{-}2^{nd}$ wiring 132 may be part of the second wiring L2. In other words, the $2\text{-}2^{nd}$ wiring 132 may include the same material as that of the $2\text{-}1^{st}$ wiring 131, and may have the same layer structure as the $2\text{-}1^{st}$ wiring 131. In addition, when viewed in the direction perpendicular to the substrate 100, the $2\text{-}2^{nd}$ wiring 132 may cross the first wiring 121.

The $2\text{-}3^{rd}$ wiring 133 may be disposed on the inter-insulating layer 103. The $2\text{-}3^{rd}$ wiring 133 may extend in the second direction with respect to the $2\text{-}2^{nd}$ wiring 132, and may be disconnected from the $2\text{-}2^{nd}$ wiring 132. The $2\text{-}3^{rd}$ wiring 133 may be part of the second wiring L2. In other words, the $2\text{-}3^{rd}$ wiring 133 may include the same material as that of the $2\text{-}1^{st}$ wiring 131, and may have the same layer structure as the $2\text{-}1^{st}$ wiring 131. When viewed from the direction perpendicular to the substrate 100, the $2\text{-}3^{rd}$ wiring 133 may not overlap the first wiring 121.

The first insulating layer 104 may be disposed on the second wiring L2. The first insulating layer 104 that covers upper portions of the second wiring L2 and has an approximately flat upper surface may be an organic insulating layer serving as a planarization layer. The first insulating layer 104 may include an organic material, such as acryl, benzocyclobutene ("BCB"), hexamethyldisiloxane ("HMDSO"), or the like. The first insulating layer 104 may be variously modified into, e.g., a single layer or a multi-layer.

The first insulating layer 104 may be disposed on the $2\text{-}1^{st}$ to $2\text{-}3^{rd}$ wirings 131 to 133. In addition, the first through-hole TH1 exposing a portion of the $2\text{-}1^{st}$ wiring 131 may be defined in the first insulating layer 104, and the second through-hole TH2 exposing a portion of the $2\text{-}3^{rd}$ wiring 133 may be defined in the first insulating layer 104. In other words, when viewed from the direction perpendicular to the substrate 100, the $2\text{-}2^{nd}$ wiring 132 described above may be disposed between the first through-hole TH1 and the second through-hole TH2. In addition, when viewed from the direction perpendicular to the substrate 100, the first wiring 121 described above may be disposed between the first through-hole TH1 and the second through-hole TH2, and may extend in the first direction.

In addition, although not shown in FIGS. 2 and 3, a second conductive layer (not shown) and a second insulating layer (not shown) may be further arranged between the first conductive layer 130 and the first pixel electrode 141 described below, and may be applied to various embodiments.

The second conductive layer (not shown) may be disposed on the first insulating layer 104, and may be patterned into a preset shape. The second conductive layer (not shown) may include the same material as that of the first conductive layer 130 described above. In some cases, the second conductive layer (not shown) may be used in a process of repairing the second wiring L2, instead of the first pixel electrode 141 described below.

The second insulating layer (not shown) may be disposed on the second conductive layer (not shown), and may cover the second conductive layer (not shown). The second insulating layer (not shown) may include the same material as that of the first insulating layer 104 described above.

The first pixel electrode 141 may be disposed on the first insulating layer 104. The first pixel electrode 141 may be a pixel electrode in an area requiring repair, such as an area in which a short occurs between the first wiring 121 and the second wiring L2. The first pixel electrode 141 may include a transmissive conductive layer including a transmissive conductive oxide, such as indium tin oxide ("ITO"), indium oxide ($In_2O_3$), indium zinc oxide ("IZO"), or the like, and a reflective layer including a metal, such as Al, Ag, or the like. In an embodiment, the first pixel electrode 141 may have a three-layered structure of ITO/Ag/ITO, for example.

The first pixel electrode 141 may include the same material and have the same layer structure as that of a plurality of other pixel electrodes 140 (FIG. 4) around the first pixel electrode 141. In addition, when viewed from the direction perpendicular to the substrate 100, an area of the first pixel electrode 141 may be less than an area of each of the plurality of other pixel electrodes 140 around the first pixel electrode 141.

The first pixel electrode 141 may be used in a repair process of the second wiring L2. The first pixel electrode 141 may be re-patterned into a preset shape to be used in the repair process of the second wiring L2.

As shown in FIG. 3, the first pixel electrode 141 may be disposed on the 2-2$^{nd}$ wiring 132, and the first pixel electrode 141 may be disposed along the 2-2nd wiring 132. After being re-patterned, the first pixel electrode 141 may have a shape corresponding to a shape of the 2-2$^{nd}$ wiring 132.

When the first pixel electrode 141 is used in a repair process of the 2-2$^{nd}$ wiring 132, a pixel in which the first pixel electrode 141 is disposed may be treated as a dark dot. In this case, a portion of an OLED may be formed on the first pixel electrode 141, and to reduce the influence of the OLED formed on the first pixel electrode 141, the area of the first pixel electrode 141 also needs to be reduced. Accordingly, to prevent the OLED formed on the first pixel electrode 141 from affecting image quality by generating light, the shape of the first pixel electrode 141 may be re-patterned into a shape corresponding to the 2-2$^{nd}$ wiring 132.

When viewed from the direction perpendicular to the substrate 100, a length LT1 of the first pixel electrode 141 in the second direction may be greater than a length LT2 of the 2-2$^{nd}$ wiring 132 in the second direction. In addition, when viewed from the direction perpendicular to the substrate 100, the area of the first pixel electrode 141 may be greater than an area of the 2-2$^{nd}$ wiring 132.

The pixel-defining layer 105 may be disposed on the first insulating layer 104, and may cover an edge of each of the plurality of pixel electrodes 140. The pixel-defining layer 105 may include an organic material, such as polyimide, HMDSO, or the like. In addition, a spacer (not shown) may be disposed on the pixel-defining layer 105. Although the spacer (not shown) is shown as being disposed in the peripheral area PA, the spacer (not shown) may be disposed in the display area DA. The spacer (not shown) may prevent the OLED from being damaged due to sagging of a mask in a manufacturing process using the mask. The spacer (not shown) may include an organic insulating material, and may be formed as a single layer or a multi-layer.

The pixel-defining layer 105 may be disposed on the first insulating layer 104, and may cover an edge of each of the plurality of pixel electrodes 140 (FIG. 4) described below. A pixel opening exposing a portion of each of the plurality of pixel electrodes 140 may be defined in the pixel-defining layer 105.

However, the pixel-defining layer 105 may not cover an edge of the first pixel electrode 141. When the first pixel electrode 141 is used in a repair process of the second wiring L2, the first pixel electrode 141 may be re-patterned into a preset shape, and the first pixel electrode 141 may not be covered by the pixel-defining layer 105, depending on the re-patterned shape. That is, as the area of the first pixel electrode 141 is reduced, when viewed from the direction perpendicular to the substrate 100, the area of the first pixel electrode 141 may be less than an area of the pixel opening in the pixel-defining layer 105.

However, depending on the patterned shape, a portion of the edge of the first pixel electrode 141 may be covered by the pixel-defining layer 105.

Consequently, by repairing a defect, such as a short, occurring in the second wiring L2 by the first pixel electrode 141, as described above, a defect in a wiring may be easily repaired even in a high-resolution display device. In addition, as a short occurring between the first wiring 121 and the second wiring L2 may affect a plurality of pixels connected to the second wiring L2, the display device in the illustrated embodiment may have an effect of repairing a defect by sacrificing only one pixel in which the first pixel electrode 141 is disposed.

Figure 4:
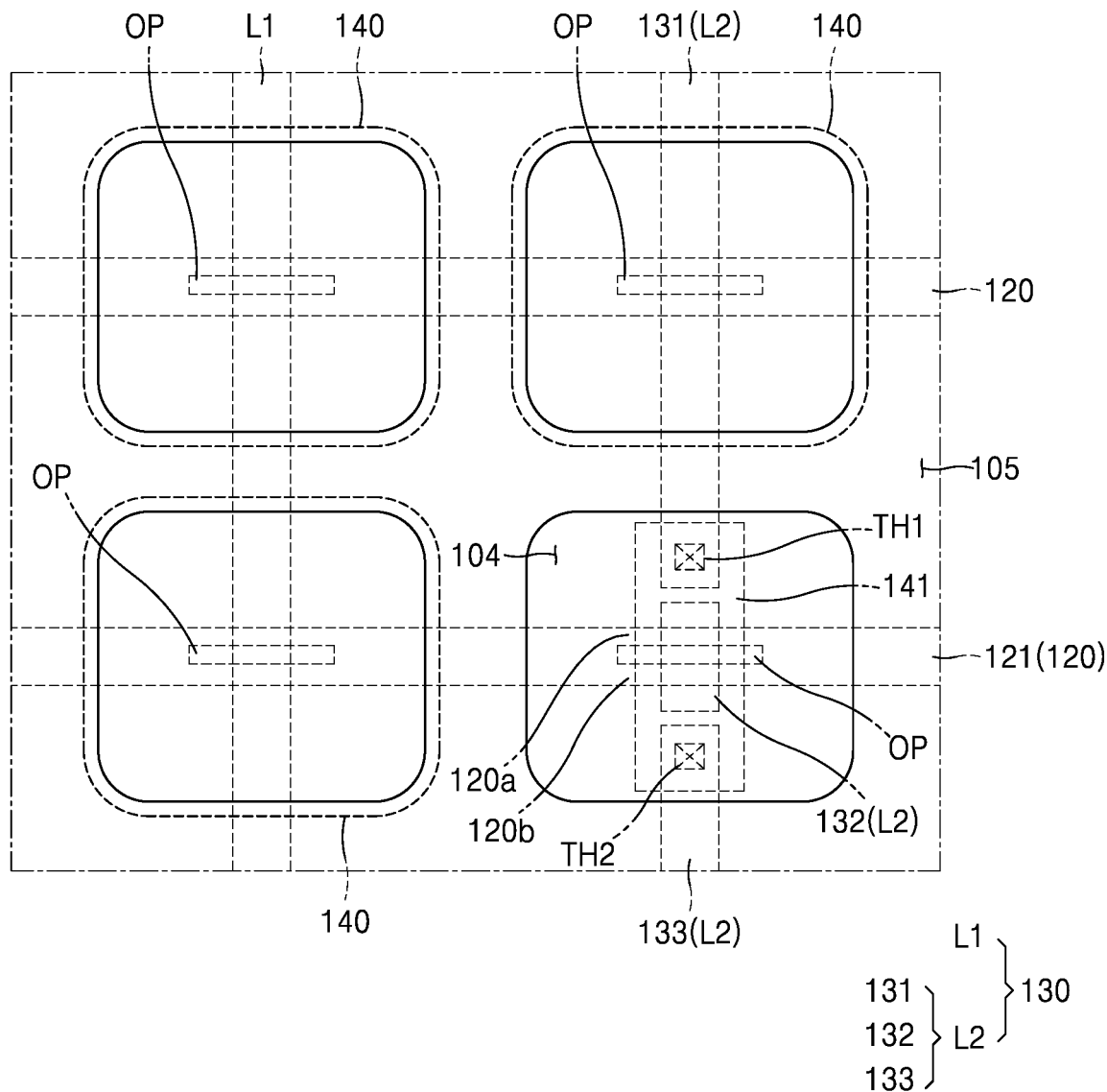
FIG. 4 is a schematic plan view of an embodiment of a portion of a display device.

FIG. 4 is a schematic plan view of a portion of the display device of FIG. 1.

As shown in FIG. 4, when viewed from the direction perpendicular to the substrate 100, the plurality of wirings included in the gate layer 120 may cross the plurality of wirings included in the first conductive layer 130 at at least one point. In this regard, an opening OP exposing the inter-insulating layer 103 at a point at which the plurality of wirings included in the gate layer 120 crosses the plurality of wirings L1 and L2 included in the first conductive layer 130 may be defined in the plurality of wirings included in the gate layer 120.

In particular, among the plurality of wirings included in the gate layer 120, an opening OP extending in the first direction, exposing the first insulating layer 104, and crossing the 2-2$^{nd}$ wiring 132 may be defined in the first wiring 121 described above, when viewed from the direction perpendicular to the substrate 100. By defining the opening OP, the first wiring 121 may be divided into a first sub-wiring 120a and a second sub-wiring 120b at a point at which the first wiring 121 crosses the 2-2$^{nd}$ wiring 132. In addition, in some cases, the first wiring 121 may have a plurality of sub-wirings.

The first sub-wiring 120a and the second sub-wiring 120b included in the first wiring 121 and the second wiring L2 may cross each other. When a short occurs between one of the first sub-wiring 120a and the second sub-wiring 120b and the second wiring L2, a defect due to the short may be repaired by disconnecting one of the first sub-wiring 120a and the second sub-wiring 120b. That is, when a defect, such as a short, occurs between the first wiring 121 and the second wiring L2, the defect may be repaired by disconnecting one of the first sub-wiring 120a and the second sub-wiring 120b included in the first wiring 121.

However, it may be difficult to determine which of the first sub-wiring 120a and the second sub-wiring 120b has the short between the first wiring 121 and the second wiring L2. Such a short may be defined as an invisible short. In the case of an invisible short, one of the first sub-wiring 120a and the second sub-wiring 120b needs to be randomly disconnected, which has a success rate of about 50%.

Accordingly, when the first wiring 121 includes the first sub-wiring 120a and the second sub-wiring 120b and an invisible short occurs at the point at which the first sub-wiring 120a and the second sub-wiring 120b and the second wiring L2 cross each other, the defect may be easily repaired by a repair process using the first pixel electrode 141 described above.

As shown in FIG. 4, the plurality of other pixel electrodes 140 may be disposed around the first pixel electrode 141. A display element may be disposed on a pixel opening of each of the plurality of other pixel electrodes 140. An organic light-emitting diode ("OLED") may be used as the display element. That is, the OLED may be disposed, e.g., on each of the plurality of pixel electrodes 140. The plurality of pixel electrodes 140 may include a transmissive conductive layer including a transmissive conductive oxide, such as ITO, $In_2O_3$, IZO, or the like, and a reflective layer including a metal, such as Al, Ag, or the like. In an embodiment, the plurality of pixel electrodes 140 may have a three-layered structure of ITO/Ag/ITO, for example.

An intermediate layer (not shown) and a counter electrode (not shown) may be disposed on the pixel opening in the pixel-defining layer 105. The intermediate layer (not shown) may include a low-molecular weight or polymer material, and when the intermediate layer includes a low-molecular weight material, the intermediate layer (not shown) may include a hole injection layer ("HIL"), a hole transport layer ("HTL"), an emission layer ("EML"), an electron transport layer ("ETL"), an electron injection layer ("EIL"), and/or the like. When the intermediate layer (not shown) includes a polymer material, the intermediate layer (not shown) may generally have a structure including an HTL and an EML. The counter electrode (not shown) may include a transmissive conductive layer including a transmissive conductive oxide, such as ITO, $In_2O_3$, IZO, or the like. Each of the plurality of pixel electrodes 140 is used as an anode, and the counter electrode (not shown) is used as a cathode. The above polarities of the electrodes may be reversely applied.

The structure of the intermediate layer (not shown) is not limited to the above description, and the intermediate layer (not shown) may have other structures. In an embodiment, at least one of the layers forming the intermediate layer (not shown) may be unitary as single body with the counter electrode (not shown), for example. In another embodiment, the intermediate layer (not shown) may include a layer patterned to correspond to each of the plurality of pixel electrodes 140.

The counter electrode (not shown) may be disposed in the display area DA, and may be disposed on the entirety of the surface of the display area DA. That is, the counter electrode (not shown) may be unitary as a single body to cover a plurality of pixels. The counter electrode (not shown) may electrically contact a common power supply line (not shown) disposed in the peripheral area PA.

Although it has been described that the OLED is disposed on each of the plurality of pixel electrodes 140 in which pixel openings are defined in the pixel-defining layer 105, the OLED may also be partially formed on the first pixel electrode 141 of FIGS. 2 to 4.

Figure 5:
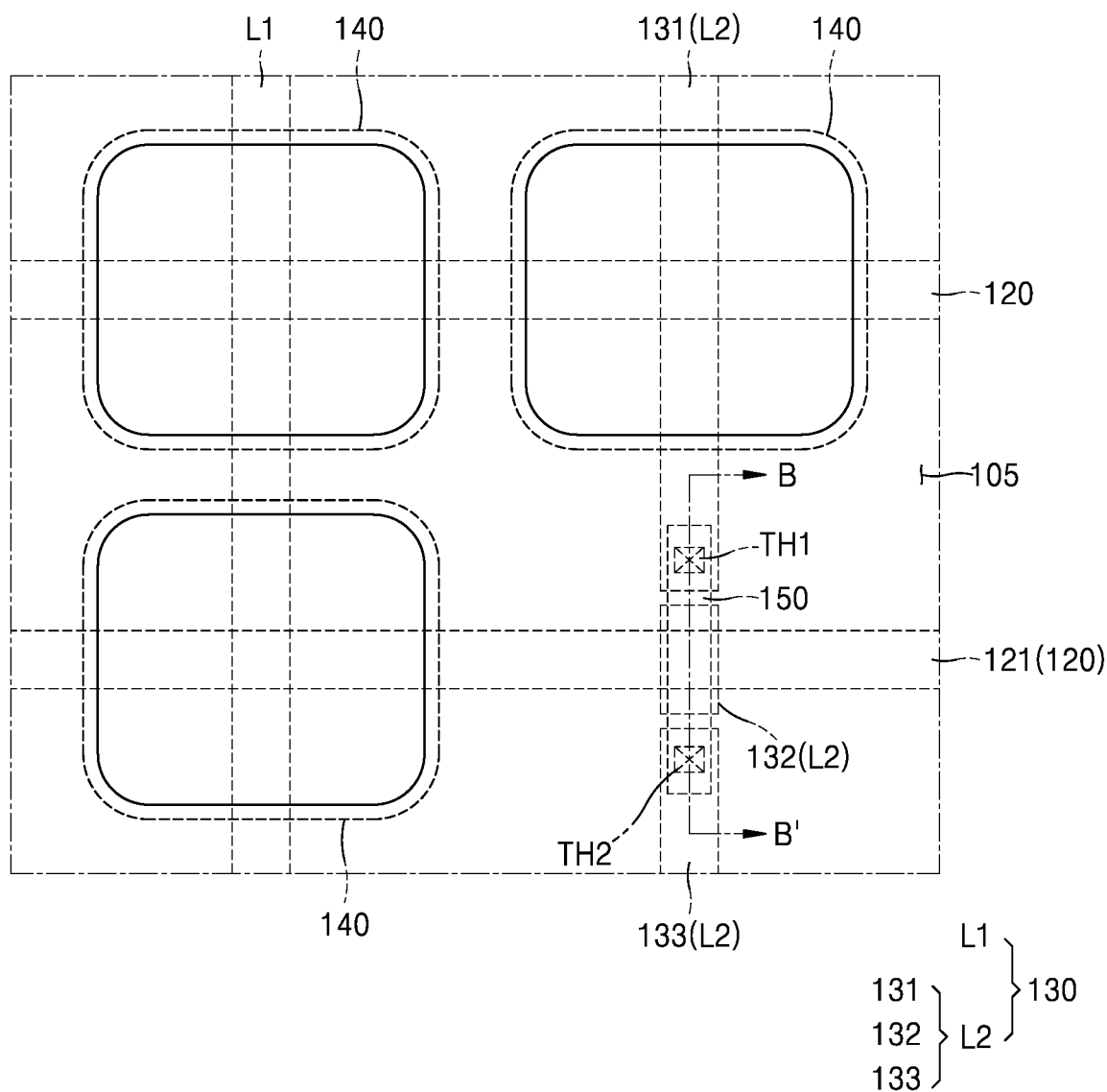
FIG. 5 is a schematic plan view of an embodiment of a portion of a display device.
Figure 6:
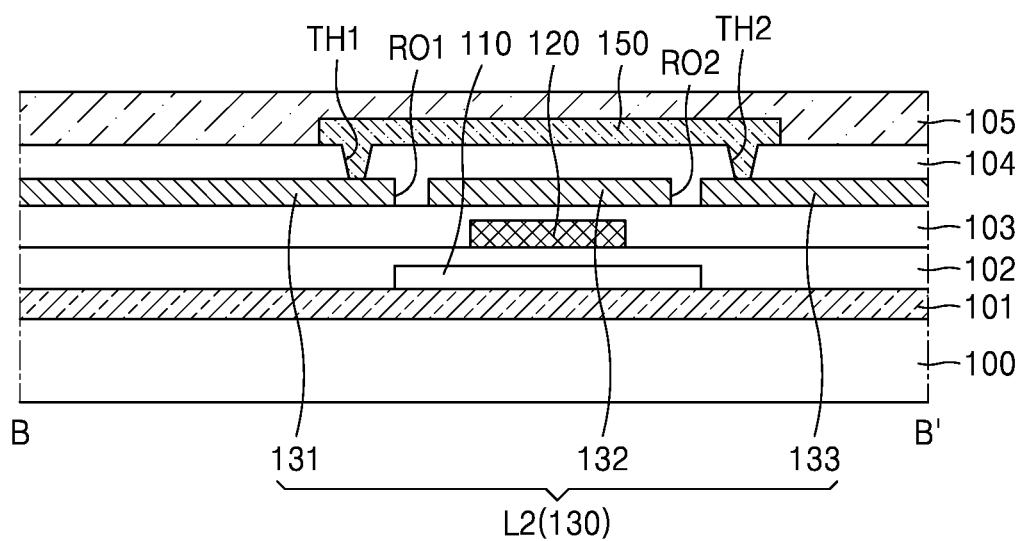
FIG. 6 is a schematic cross-sectional view of a region taken along line B-B' in the portion of the display device of FIG. 5.

FIG. 5 is a schematic plan view of an embodiment of a portion of a display device, and FIG. 6 is a schematic cross-sectional view of a region taken along line B-B' in the portion of the display device of FIG. 5. However, when describing FIGS. 5 and 6, descriptions that are the same as or correspond to the above descriptions may be omitted.

As shown in FIGS. 5 and 6, a repair line 150 may be connected to the $2\text{-}1^{st}$ wiring 131 and the $2\text{-}3^{rd}$ wiring 133 through the first through-hole TH1 and the second through-hole TH2. In this regard, the repair line 150 may be formed on the first insulating layer 104 through a separate forming process.

A process of forming the repair line 150 may be an inkjet printing process using nano-paste including metal. The nano-paste including metal may be, e.g., Ag paste or Cu paste. In addition, the nano-paste including metal may refer to paste including various metal components. The inkjet printing process using nano-paste may be a process suitable for forming a fine repair line 150 in a high-resolution display device.

The repair line 150 including or consisting of nano-paste may be connected to the $2\text{-}1^{st}$ wiring 131 through the first through-hole TH1 in the first insulating layer 104, and may be connected to the $2\text{-}3^{rd}$ wiring 133 through the second through-hole TH2 in the first insulating layer 104.

The repair line 150 may be disposed along the $2\text{-}2^{nd}$ wiring 132. When viewed from the direction perpendicular to the substrate 100, a length of the repair line 150 in the second direction may be greater than the length of the $2\text{-}2^{nd}$ wiring 132 in the second direction. In addition, a shape of the repair line 150 may correspond to the shape of the $2\text{-}2^{nd}$ wiring 132.

In addition, the pixel-defining layer 105 may be disposed on the repair line 150, and may cover the repair line 150. The repair line 150 may not be exposed to the outside. In other words, when the first pixel electrode 141 is disposed at a point at which the first wiring 121 and the second wiring L2 cross each other, the first pixel electrode 141 may be used to repair the second wiring L2. Conversely, when a pixel electrode is not disposed at the point at which the first wiring 121 and the second wiring L2 cross each other, the repair line 150 may be used instead of the pixel electrode.

Figure 7:
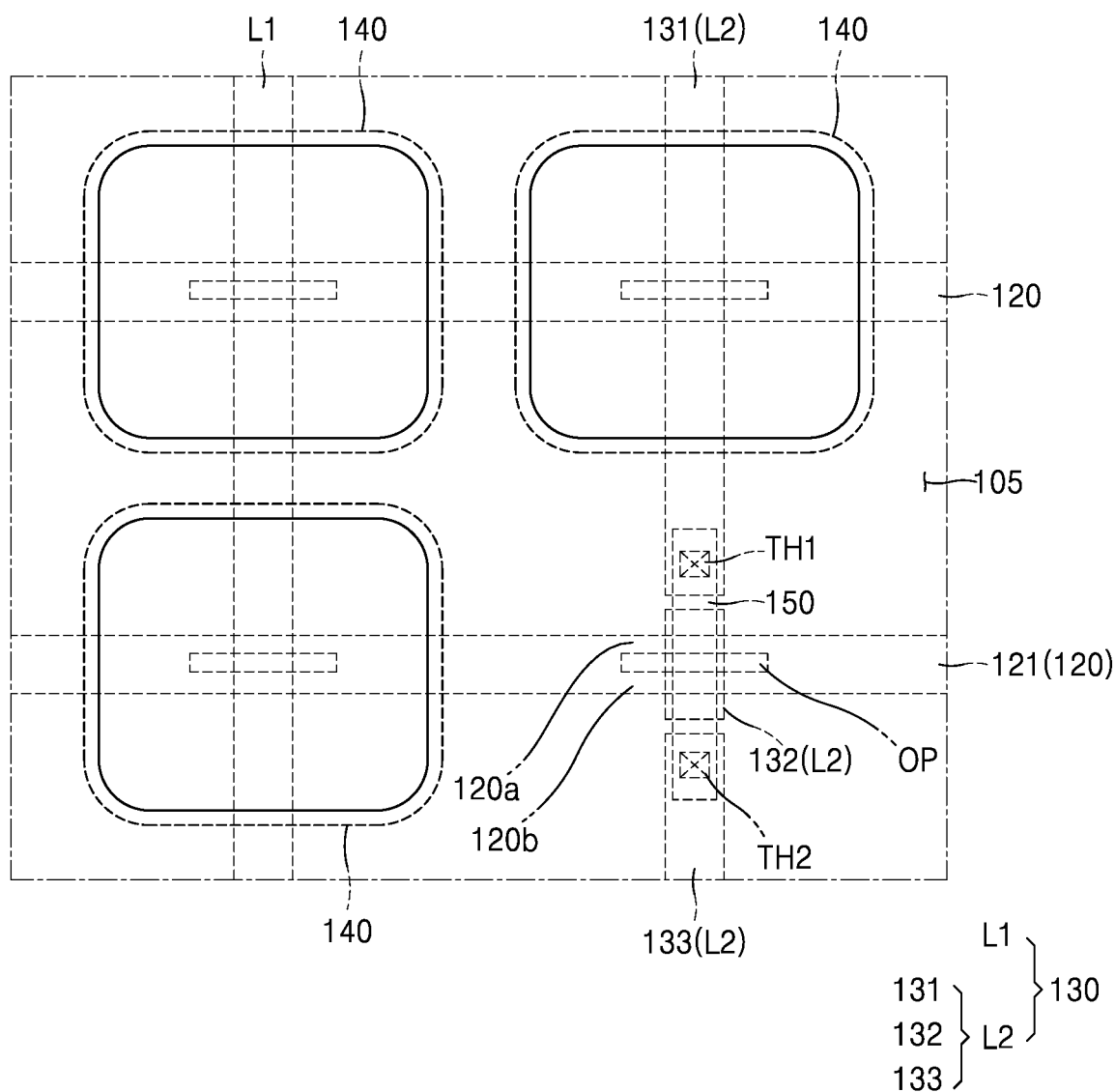
FIG. 7 is a schematic plan view of an embodiment of a portion of a display device.

FIG. 7 is a schematic plan view of an embodiment of a portion of a display device.

As shown in FIG. 7, when viewed from the direction perpendicular to the substrate 100, the plurality of wirings included in the gate layer 120 may cross the plurality of wirings included in the first conductive layer 130 at at least one point. In this regard, an opening OP exposing the inter-insulating layer 103 at a point at which the plurality of wirings included in the gate layer 120 crosses the plurality of wirings included in the first conductive layer 130 may be defined in the plurality of wirings included in the gate layer 120. Descriptions of the opening OP may be the same as or correspond to the descriptions provided above with reference to FIG. 4 and may thus be omitted.

Figure 8:
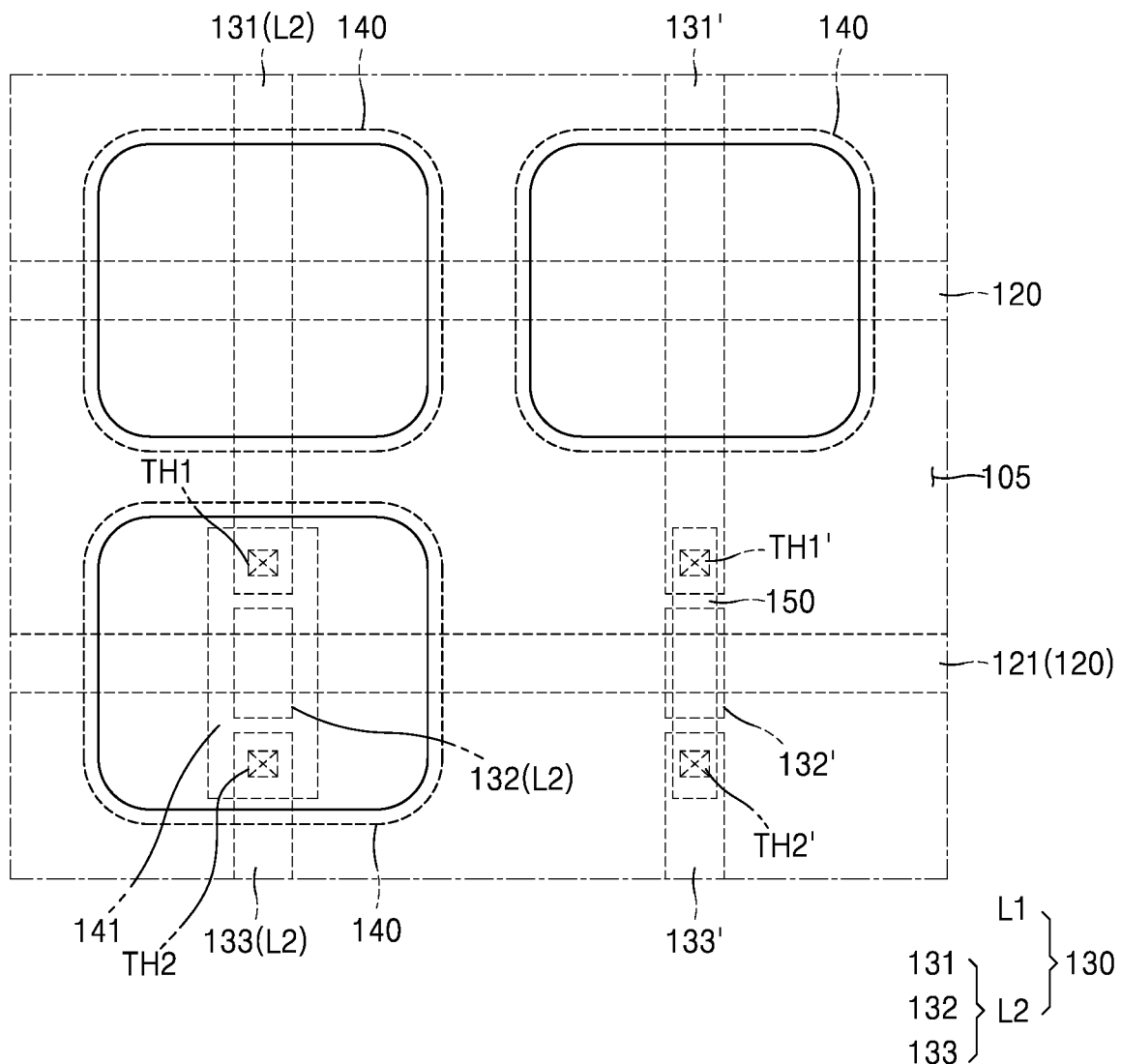
FIG. 8 is a schematic plan view of an embodiment of a portion of a display device.

FIG. 8 is a schematic plan view of an embodiment of a portion of a display device.

As shown in FIG. 8, when the first pixel electrode 141 is disposed at a point at which the first wiring 121 and the second wiring L2 cross each other, the first pixel electrode 141 may be re-patterned, and the first pixel electrode 141 may be connected to the 2-1$^{st}$ wiring 131 and the 2-3$^{rd}$ wiring 133 through the first through-hole TH1 and the second through-hole TH2.

In addition, when a pixel electrode is not disposed at a point at which the first wiring 121 and a 2-2$^{nd}$ wiring 132' cross each other, a separate repair line 150 may be formed, and the repair line 150 may be connected to a 2-1$^{st}$ wiring 131' and a 2-3$^{rd}$ wiring 133' through a first through-hole TH1' and a second through-hole TH2'.

As such, a repair process using the first pixel electrode 141 and a repair process using the repair line 150 may both be applied to one display device. However, although the repair process using the first pixel electrode 141 and the repair process using the repair line 150 are shown to be applied to adjacent areas for convenience of description, this is merely one of embodiments, and the scope of the illustrated embodiment is not limited thereto.

Hereinafter, a method of repairing a display device (hereinafter, a repair method), in an embodiment, is described in detail based on the above descriptions.

However, when describing the repair method in the illustrated embodiment, descriptions that are the same as or correspond to the above descriptions of the display device may be omitted.

FIGS. 9 to 13 are schematic cross-sectional views showing a method of repairing a display device, in an embodiment, in chronological order.

Figure 9:
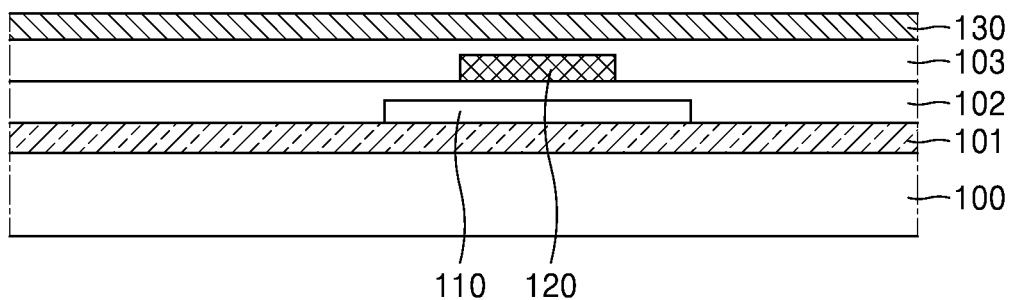
FIGS. 9 to 13 are schematic cross-sectional views showing an embodiment of a method of repairing a display device, in chronological order.

As shown in FIG. 9, the repair method in the illustrated embodiment may include an operation of forming the first wiring 121 on the substrate 100, the inter-insulating layer 103 on the first wiring 121, and the second wiring L2 on the inter-insulating layer 103, the first wiring 121 extending in the first direction, and the second wiring L2 extending in the second direction crossing the first direction.

In an embodiment, the gate layer 120 including the first wiring 121 may be formed by a deposition method, such as CVD, thermal chemical vapor deposition ("TCVD"), plasma enhanced chemical vapor deposition ("PECVD"), or the like, for example. The gate layer 120 may be patterned into a preset shape, and may include a plurality of wirings including the first wiring 121 after being patterned. In this regard, a patterning process is described below.

A patterning process of patterning the gate layer 120 into a preset shape may include a photolithography process using a mask and an etching process. Here, the photolithography process may use a negative photoresist or a positive photoresist.

The mask may be divided into a transmission area through which light is transmitted and a blocking area that blocks light transmission, according to light transmittance. However, in some cases, a halftone mask may be used, and the type of mask may be variously changed, and thus, the scope an embodiment is not limited by the type of mask.

The patterning process is described below. First, after applying a negative photoresist on the gate layer 120, the photoresist may be exposed through a mask and developed. A first portion of the photoresist corresponding to a transmission area of the mask is not removed and remains at a great thickness, and a second portion thereof corresponding to a blocking area of the mask is not exposed and is thus removed. When the gate layer 120 is etched using the photoresist pattern thus formed, the first wiring 121 having a pattern of a preset shape and/or a plurality of other wirings may be formed in an area corresponding to the first portion.

The above process of forming the first wiring 121 may be equally used in a process of forming the second wiring L2.

The inter-insulating layer 103 may be formed by a deposition method, such as CVD, TCVD, PECVD, or the like. The inter-insulating layer 103 may be formed according to the shapes of the gate insulating layer 102 and the gate layer 120. That is, the inter-insulating layer 103 may be deposited and formed according to the shape of the gate layer 120, and accordingly, the shape of a portion of a lower surface of the inter-insulating layer 103 may correspond to the shapes of a sidewall and an upper surface of the gate layer 120.

After forming the second wiring L2, a short may occur between the first wiring 121 and the second wiring L2, or a defect may occur at the point at which the first wiring 121 and the second wiring L2 cross each other. Accordingly, the operation of forming the second wiring L2 may further include detecting a defect, such as a short, occurring between the first wiring 121 and the second wiring L2. When a defect, such as a short, is detected, the following process may be performed to repair the defect.

The operation of forming the second wiring L2 may include, after forming the first wiring 121, defining, in the first wiring 121, the opening OP extending in the first direction and exposing the inter-insulating layer 103, where, when viewed from the direction perpendicular to the substrate 100, the second wiring L2 may cross the opening OP. Description of the opening OP exposing the inter-insulating layer 103 may be the same as or correspond to the above descriptions and may thus be omitted.

Figure 10:
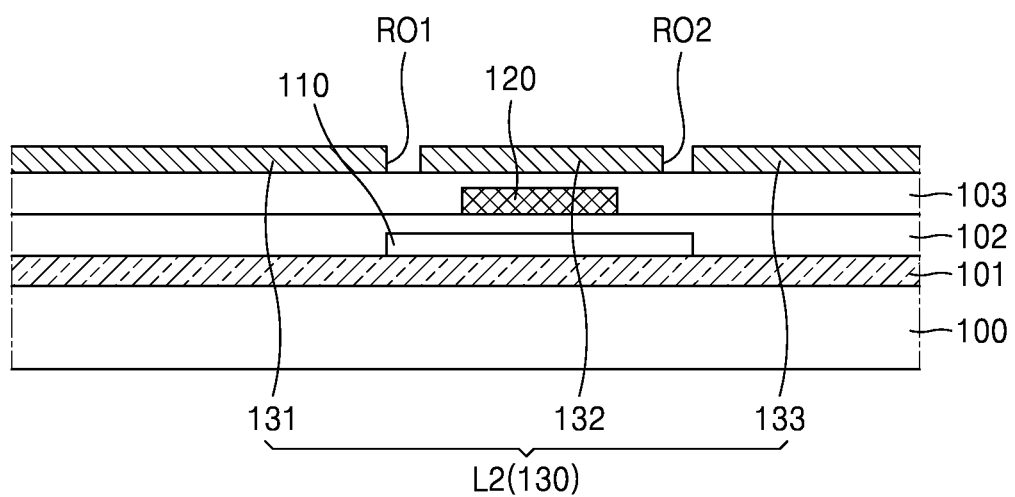

As shown in FIG. 10, the repair method in the illustrated embodiment may include, after forming the second wiring L2, an operation of disconnecting the second wiring L2. The operation of disconnecting the second wiring L2 may include precisely cutting the second wiring L2 by a laser irradiated from a laser generating device. The operation of disconnecting the second wiring L2 may include disconnecting the second wiring L2 at at least two locations around the point at which the second wiring L2 and the first wiring 121 cross each other, where a laser may be irradiated to an area in which the second wiring L2 and the first wiring 121 do not overlap each other to disconnect the second wiring L2. This may be to prevent the first wiring 121 from also being affected by the laser.

As shown in FIG. 10, the operation of disconnecting the second wiring L2 may include forming the 2-1$^{st}$ wiring 131 extending in the second direction crossing the first direction, by disconnecting the second wiring L2 at the at least two locations.

In addition, the operation of disconnecting the second wiring L2 may include forming the 2-2$^{nd}$ wiring 132 extending from the 2-1$^{st}$ wiring 131 in the second direction, disconnected from the 2-1$^{st}$ wiring 131, and crossing the first wiring 121 when viewed from the direction perpendicular to the substrate 100.

In addition, the operation of disconnecting the second wiring L2 may include forming the 2-3$^{rd}$ wiring 133 extending from the 2-2$^{nd}$ wiring 132 in the second direction and disconnected from the 2-2$^{nd}$ wiring 132.

The 2-1$^{st}$ to 2-3$^{rd}$ wirings 131 to 133 may be formed on the inter-insulating layer 103 described above. When viewed from the direction perpendicular to the substrate 100, the 2-2$^{nd}$ wiring 132 may be disposed between the first through-hole TH1 and the second through-hole TH2.

Figure 11:
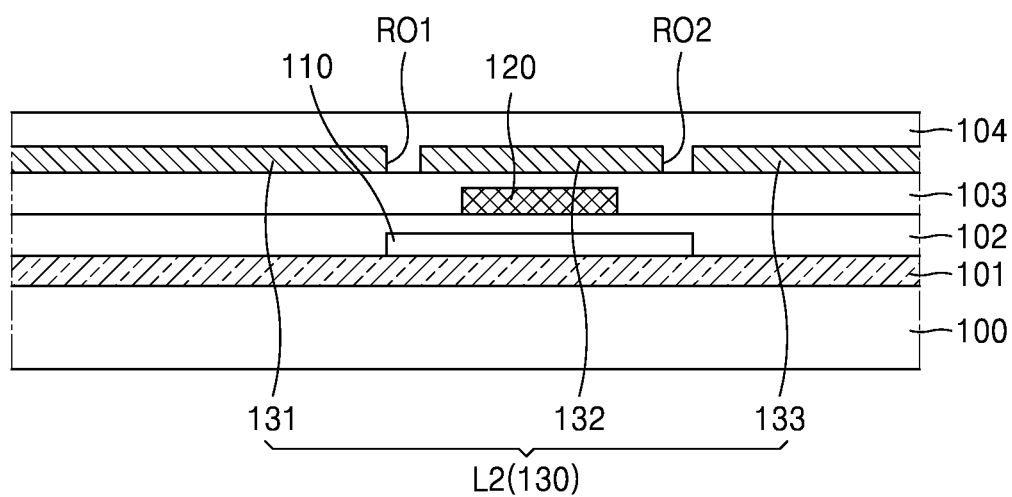

As shown in FIG. 11, the repair method in the illustrated embodiment may include, after forming the 2-1$^{st}$ to 2-3$^{rd}$ wirings 131 to 133, an operation of forming the first insulating layer 104 on the 2-1$^{st}$ to 2-3$^{rd}$ wirings 131 to 133. Descriptions of the first insulating layer 104 may be the same as or correspond to the above descriptions and may thus be omitted. The first insulating layer 104 may fill the first cutting region RO1 between the 2-1$^{st}$ wiring 131 and the 2-2$^{nd}$ wiring 132, and may fill the second cutting region RO2 between the 2-2$^{nd}$ wiring 132 and the 2-3$^{rd}$ wiring 133.

The first insulating layer 104 may be formed by a deposition method, such as CVD, TCVD, PECVD, or the like. The first insulating layer 104 may be formed according to the shape of the first conductive layer 130 including the 2-1$^{st}$ to 2-3$^{rd}$ wirings 131 to 133.

Figure 12:
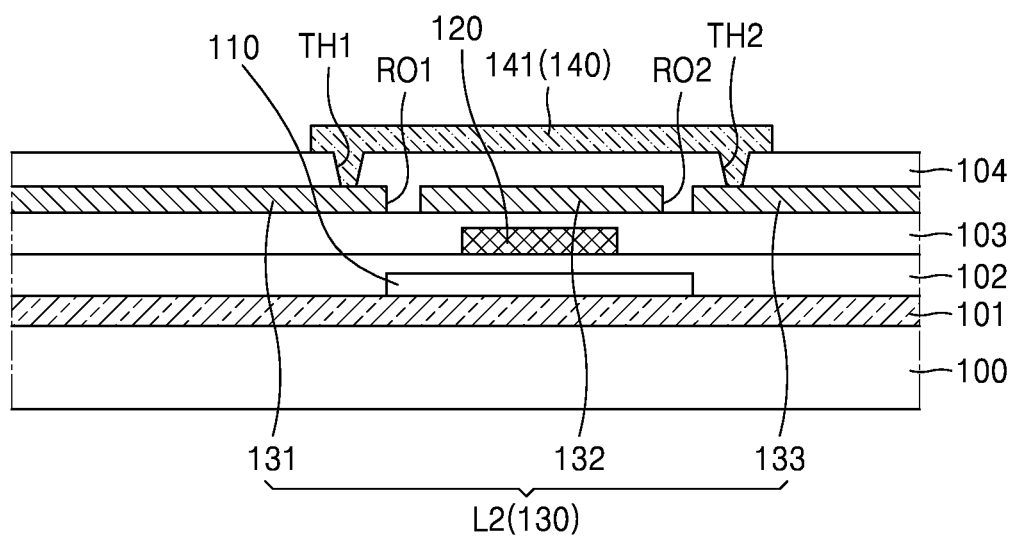

As shown in FIG. 12, the repair method in the illustrated embodiment may include, after forming the first insulating layer 104, an operation of defining, in the first insulating layer 104, the first through-hole TH1 exposing a portion of the 2-1$^{st}$ wiring 131 and a second through-hole TH2 exposing a portion of the 2-3$^{rd}$ wiring 133. A process of defining the first through-hole TH1 and the second through-hole TH2 may be a patterning process using a mask as described above.

As shown in FIG. 12, the repair method in the illustrated embodiment may include, after defining the first through-hole TH1 and the second through-hole TH2, an operation of forming the first pixel electrode 141 disposed on the first insulating layer 104. The operation of forming the first pixel electrode 141 may include connecting the first pixel electrode 141 to the 2-1$^{st}$ wiring 131 through the first through-hole TH1. In addition, the operation of forming the first pixel electrode 141 may include connecting the first pixel electrode 141 to the 2-2$^{nd}$ wiring 132 through the second through-hole TH2. The process of forming the first pixel electrode 141 may be one of the various deposition methods described above.

In this regard, the first pixel electrode 141 may be disposed along the 2-2$^{nd}$ wiring 132, and the length of the first pixel electrode 141 in the second direction may be greater than the length of the 2-2$^{nd}$ wiring 132 in the second direction.

As shown in FIG. 12, the repair method in the illustrated embodiment may further include, after forming the first pixel electrode 141, an operation of changing the shape of the first pixel electrode 141 to a shape corresponding to the 2-2$^{nd}$ wiring 132. This may refer to a process of re-patterning the first pixel electrode 141 into a preset shape, as described above.

Figure 13:
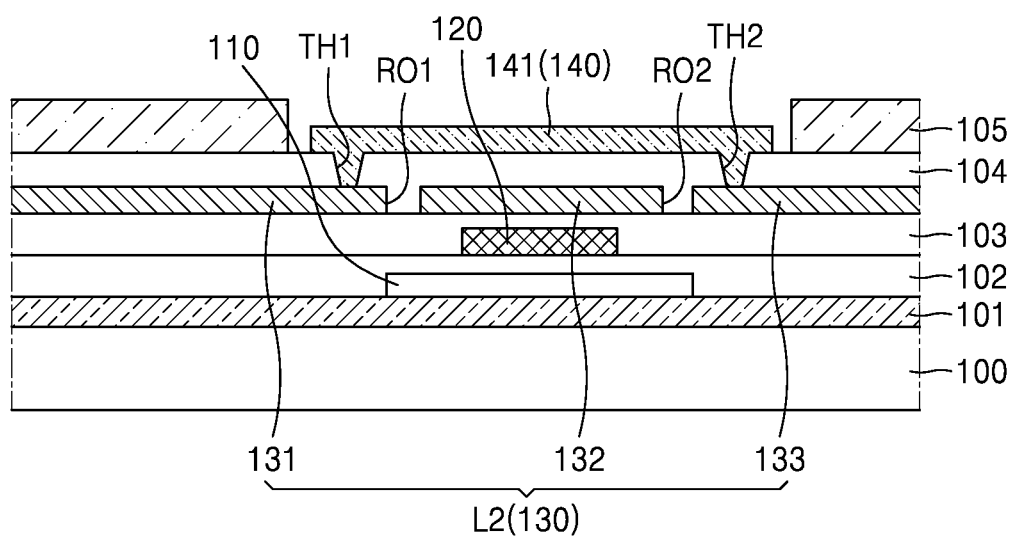

As shown in FIG. 13, the repair method in the illustrated embodiment may further include an operation of forming the pixel-defining layer 105 disposed on the first insulating layer 104, where, as described above, the pixel-defining layer 105 may cover a portion of the edge of the first pixel electrode 141, or may not cover the edge of the pixel electrode, depending on the re-patterned shape of the first pixel electrode 141.

According to embodiments as described above, a display device in which a short occurring in a wiring included in a high-resolution display may be repaired, and a method of repairing the display device may be implemented. However, the scope of the disclosure is not limited by this effect.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display device comprising:
   a substrate;
   a first wiring disposed on the substrate and extending in a first direction;
   an inter-insulating layer disposed on the first wiring;
   a 2-1$^{st}$ wiring disposed on the inter-insulating layer and extending in a second direction crossing the first direction;
   a 2-2$^{nd}$ wiring disposed on the inter-insulating layer, adjacent to the 2-1$^{st}$ wiring in the second direction, disconnected from the 2-1$^{st}$ wiring, and crossing the first wiring in a plan view;
   a 2-3$^{rd}$ wiring disposed on the inter-insulating layer, adjacent to the 2-2$^{nd}$ wiring in the second direction, and disconnected from the 2-2$^{nd}$ wiring;
   a first insulating layer which is disposed on the 2-1$^{st}$ to 2-3$^{rd}$ wirings and in which a first through-hole and a second through-hole are defined, the first through-hole exposing a portion of the 2-1$^{st}$ wiring, and the second through-hole exposing a portion of the 2-3$^{rd}$ wiring; and
   a first pixel electrode disposed on the first insulating layer, connected to the 2-1$^{st}$ wiring through the first through-hole, and connected to the 2-3$^{rd}$ wiring through the second through-hole.

2. The display device of claim 1, wherein the 2-2$^{nd}$ wiring includes a same material as a material of the 2-1$^{st}$ wiring, and has a same layer structure as a layer structure of the 2-1$^{st}$ wiring.

3. The display device of claim 1, wherein the 2-3$^{rd}$ wiring includes a same material as a material of the 2-1$^{st}$ wiring, and has a same layer structure as a layer structure of the 2-1$^{st}$ wiring.

4. The display device of claim 1, wherein, in the plan view, the 2-2$^{nd}$ wiring is disposed between the first through-hole and the second through-hole.

5. The display device of claim 1, wherein the first pixel electrode has a shape corresponding to a shape of the 2-2$^{nd}$ wiring.

6. The display device of claim 1, wherein the first pixel electrode is disposed along the 2-2$^{nd}$ wiring.

7. The display device of claim 1, wherein, in the plan view, a length of the first pixel electrode in the second direction is greater than a length of the 2-2$^{nd}$ wiring in the second direction.

8. The display device of claim 1, wherein, in the plan view, an opening extending in the first direction, exposing the first insulating layer, and crossing the 2-2$^{nd}$ wiring is defined in the first wiring.

9. A method of repairing a display device, the method comprising:
   forming a first wiring on a substrate, an inter-insulating layer on the first wiring, and a second wiring on the inter-insulating layer, the first wiring extending in a first direction, and the second wiring extending in a second direction crossing the first direction;
   forming a 2-1$^{st}$ wiring, a 2-2$^{nd}$ wiring, and a 2-3$^{rd}$ wiring on the inter-insulating layer by disconnecting the second wiring, the 2-1$^{st}$ wiring extending in the second direction crossing the first direction, the 2-2$^{nd}$ wiring extending from the 2-1$^{st}$ wiring in the second direction, being disconnected from the 2-1$^{st}$ wiring, and crossing the first wiring in a plan view, and the 2-3$^{rd}$ wiring extending from the 2-2$^{nd}$ wiring in the second direction and being disconnected from the 2-2$^{nd}$ wiring;

forming a first insulating layer on the $2\text{-}1^{st}$ to $2\text{-}3^{rd}$ wirings;

defining a first through-hole and a second through-hole in the first insulating layer, the first through-hole exposing a portion of the $2\text{-}1^{st}$ wiring, and the second through-hole exposing a portion of the $2\text{-}3^{rd}$ wiring; and forming a first pixel electrode disposed on the first insulating layer, connected to the $2\text{-}1^{st}$ wiring through the first through-hole, and connected to the $2\text{-}3^{rd}$ wiring through the second through-hole.

10. The method of claim 9, further comprising, after the forming the first pixel electrode, changing a shape of the first pixel electrode to a shape corresponding to the $2\text{-}2^{nd}$ wiring.

11. The method of claim 9, wherein, in the plan view, the $2\text{-}2^{nd}$ wiring is disposed between the first through-hole and the second through-hole.

12. The method of claim 9, wherein, in the plan view, the first pixel electrode is disposed along the $2\text{-}2^{nd}$ wiring.

13. The method of claim 9, wherein, in the plan view, a length of the first pixel electrode in the second direction is greater than a length of the $2\text{-}2^{nd}$ wiring in the second direction.

14. The method of claim 9, wherein the forming the second wiring includes, after forming the first wiring, defining an opening extending in the first direction and exposing the inter-insulating layer in the first wiring.

15. The method of claim 14, wherein, in the plan view, the $2\text{-}2^{nd}$ wiring crosses the opening.

* * * * *